(12) United States Patent
Liu et al.

(10) Patent No.: US 11,864,415 B2
(45) Date of Patent: Jan. 2, 2024

(54) DISPLAY PANEL AND PREPARATION METHOD THEREOF, AND DISPLAY APPARATUS

(71) Applicant: BOE Technology Group Co., Ltd., Beijing (CN)

(72) Inventors: Wenqu Liu, Beijing (CN); Feng Zhang, Beijing (CN); Qi Yao, Beijing (CN); Zhao Cui, Beijing (CN); Xiaoxin Song, Beijing (CN); Zhijun Lv, Beijing (CN); Dongfei Hou, Beijing (CN); Detian Meng, Beijing (CN); Liwen Dong, Beijing (CN); Libo Wang, Beijing (CN); Yang Yue, Beijing (CN); Haitao Huang, Beijing (CN); Chuanxiang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 269 days.

(21) Appl. No.: 17/358,016

(22) Filed: Jun. 25, 2021

(65) Prior Publication Data
US 2022/0149334 A1 May 12, 2022

(30) Foreign Application Priority Data
Nov. 10, 2020 (CN) .......................... 202011249803.2

(51) Int. Cl.
*H10K 50/858* (2023.01)
*H10K 59/38* (2023.01)
(Continued)

(52) U.S. Cl.
CPC ......... *H10K 50/858* (2023.02); *H10K 59/124* (2023.02); *H10K 59/38* (2023.02); *H10K 71/00* (2023.02); *H10K 59/1201* (2023.02)

(58) Field of Classification Search
None
See application file for complete search history.

(56) References Cited

U.S. PATENT DOCUMENTS

| 10,788,700 | B1 * | 9/2020 | Li | G02F 1/133512 |
| 2012/0147296 | A1 * | 6/2012 | Montgomery | G02F 1/133615 362/606 |
| 2022/0336780 | A1 | 10/2022 | Sun et al. | |

FOREIGN PATENT DOCUMENTS

| CN | 109799655 A | * | 5/2019 | ............. G02B 6/005 |
| CN | 110187548 A | * | 8/2019 | ....... G02F 1/133528 |

(Continued)

*Primary Examiner* — Michael Lebentritt
(74) *Attorney, Agent, or Firm* — Ling Wu; Stephen Yang; Ling and Yang Intellectual Property

(57) ABSTRACT

Provided are a display panel and a preparation method thereof, and a display apparatus. The display panel includes a first display region, and the first display region includes multiple sub-display regions and a first light transmittance region located between adjacent sub-display regions. Each first sub-display region of the multiple sub-display regions includes a first light-emitting element and a first filter unit disposed in a first light-emergence direction of the first light-emitting element. Each second sub-display region in the multiple sub-display regions includes a first collimating light extraction element disposed in a second light-emergence direction of the first light-emitting element and a second filter unit disposed in a light-emergence direction of the first collimating light extraction element.

20 Claims, 7 Drawing Sheets

(51) Int. Cl.
*H10K 59/124* (2023.01)
*H10K 71/00* (2023.01)
*H10K 59/12* (2023.01)

(56) References Cited

FOREIGN PATENT DOCUMENTS

| | | | | |
|---|---|---|---|---|
| CN | 111653683 A | | 9/2020 | |
| CN | 111697162 A | * | 9/2020 | |
| CN | 116156955 A | * | 5/2023 | |
| WO | WO-2020007181 A1 | * | 1/2020 | ............ G02B 6/0038 |
| WO | WO-2022246690 A1 | * | 12/2022 | ......... H10K 59/1201 |
| WO | WO-2022262817 A1 | * | 12/2022 | |
| WO | WO-2023065206 A1 | * | 4/2023 | |

\* cited by examiner

DISPLAY PANEL AND PREPARATION METHOD THEREOF, AND DISPLAY APPARATUS

CROSS-REFERENCE TO RELATED APPLICATION

The present application claims the priority of Chinese Patent Application No. 202011249803.2 filed to the CNIPA on Nov. 10, 2020, the content of which is hereby incorporated by reference.

Technical Field

Embodiments of the present disclosure relate to, but are not limited to, the field of display technology, and particularly relate to a display panel and a preparation method thereof, and a display apparatus.

Background

Organic Light-Emitting Device (OLED) display panel has advantages such as self-luminescence, high color gamut, good temperature characteristics, low power consumption, high response speed, flexibility, ultra-thinness and low cost. Therefore, it has become one of the important developments and discoveries of new generation display apparatus and has attracted more and more attention.

A Full-screen display apparatus has attracted wide attentions in the recent years and has broad application prospects. A full-screen display panel is achieved by providing an under-screen photosensitive element, such as a camera, a light sensor, a fingerprint sensor and so on, in a display region. However, in such a full-screen display apparatus, the display region corresponding to the photosensitive elements has the problems of low transmittance and poor display effect.

SUMMARY

The following is a summary of subject matters described in detail in the present disclosure. The summary is not intended to limit the protection scope of the claims.

Embodiments of the present disclosure mainly provide following technical solutions.

In a first aspect, an embodiment of the present disclosure provides a display panel, which includes a first display region, and the first display region includes multiple sub-display regions and a first light transmittance region located between adjacent sub-display regions.

Each first sub-display region of the multiple sub-display regions includes a first light-emitting element and a first filter unit disposed in a first light-emergence direction of the first light-emitting element.

Each second sub-display region in the multiple sub-display regions includes a first collimating light extraction element disposed in a second light-emergence direction of the first light-emitting element and a second filter unit disposed in a light-emergence direction of the first collimating light extraction element.

Each third sub-display region in the multiple sub-display regions includes a second collimating light extraction element disposed in a third light-emergence direction of the first light-emitting element and a third filter unit disposed in a light-emergence direction of the second collimating light extraction element.

In a second aspect, an embodiment of the present disclosure provides a display apparatus, which includes any of the above display panels and a photosensitive element, and the photosensitive element is disposed in a first display region of the display panel.

In a third aspect, an embodiment of the present disclosure provides a preparation method of a display panel, including:
  forming a drive structure layer on a substrate;
  forming a light-emitting structure layer on the drive structure layer, wherein the light-emitting structure layer includes multiple first light-emitting elements;
  forming a thin film encapsulation layer covering the light-emitting structure layer;
  forming a light extraction structure layer on the thin film encapsulation layer, wherein the light extraction structure layer includes multiple first collimating light extraction elements and multiple second collimating light extraction elements; wherein each first collimating light extraction element is located in a second light-emergence direction of a first light-emitting element corresponding to the first collimating light extraction element; each second collimating light extraction element is located in a third light-emergence direction of a first light-emitting element corresponding to the second collimating light extraction element;
  forming a low-refractive-index reflecting layer covering the light extraction structure layer;
  forming a color filter layer on the low-refractive-index reflecting layer, wherein the color filter layer includes multiple first filter units, multiple second filter units and multiple third filter units; wherein each first filter unit is located in a first light-emergence direction of a first light-emitting element corresponding to the first filter unit; each second filter unit is located in a light-emergence direction of a first collimating light extraction element corresponding to the second filter unit; and each third filter unit is located in a light-emergence direction of a second collimating light extraction element corresponding to the third filter unit.

Other features and advantages of the present disclosure will be set forth in the following specification, and will become apparent partially from the specification, or be understood by implementing the present disclosure. Other advantages of the present disclosure may be achieved and obtained by the solutions described in the specification and drawings.

Other aspects may become apparent upon reading and understanding the accompanying drawings and the detailed description.

BRIEF DESCRIPTION OF DRAWINGS

The accompanying drawings are intended to provide a further understanding of technical solutions of the present disclosure and form a portion of the specification, and are intended to explain the technical solutions of the present disclosure together with embodiments of the present disclosure and not constitute a limitation to the technical solutions of the present disclosure. Shapes and sizes of various components in the drawings do not reflect true scales and are intended to illustrate schematically contents of the present disclosure only.

DETAILED DESCRIPTION

Figures 1A, 1B:
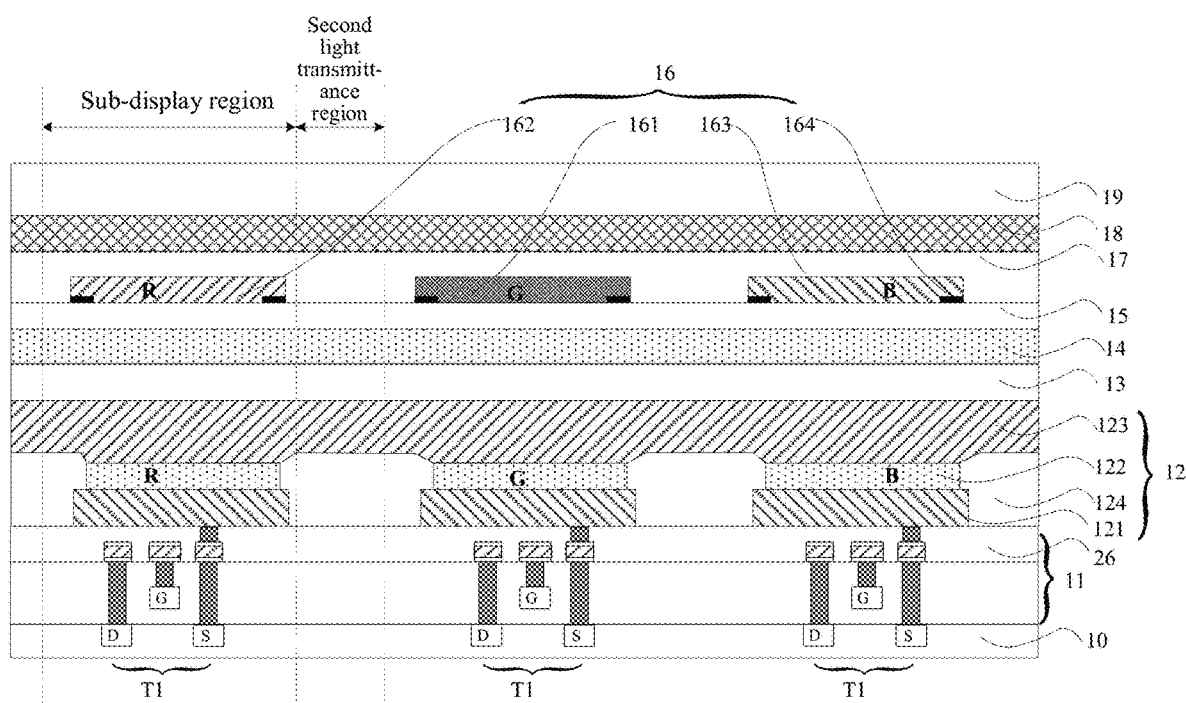
FIG. 1A is a schematic diagram of a structure of an OLED display panel.
FIG. 1B is a schematic diagram of a display region adopting a low pixel design.

Multiple embodiments are described in the present disclosure, but the description is exemplary rather than limiting, and there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

When describing representative embodiments, the specification may have presented methods and/or processes as a specific sequence of steps. However, to the extent that the method or process does not depend on the specific order of steps described in the present disclosure, the method or process should not be limited to the specific order of steps described. As understood by those of ordinary skills in the art, other orders of steps are also possible. Therefore, the specific order of steps set forth in the specification should not be interpreted as limitation to the claims. In addition, the claims for the method and/or process should not be limited to the steps performed in the written order, and those of skilled in the art may readily understand that these orders may vary and still remain within the essence and scope of the embodiments of the present disclosure.

Unless otherwise defined, technical terms or scientific terms used in the embodiments shall have common meanings as construed by those of ordinary skills in the art to which the present disclosure pertains. The words "first", "second" and the like used in the embodiments of the present disclosure do not represent any order, quantity or importance, but are merely used to distinguish among different components. The words "include", "contain" or the like mean that elements or articles appearing before the words cover elements or articles listed after the words and their equivalents, without excluding other elements or articles. The words "connect", "link" or the like are not limited to physical or mechanical connection, but may include electrical connection, whether direct or indirect.

In the present disclosure, a transistor refers to an element including at least three terminals, namely, a gate electrode, a drain electrode and a source electrode. The transistor has a channel region between the drain electrode (or referred to as a drain electrode terminal, a drain region or a drain electrode) and the source electrode (or referred to as a source electrode terminal, a source region or a source electrode), and a current can flow through the drain electrode, the channel region and the source electrode. In the present disclosure, the channel region refers to a region through which the current mainly flows.

In the present disclosure, in a situation where transistors with opposite polarities are used or a current direction is changed in an operation of a circuit, a function of the "source electrode" and a function of the "drain electrode" can sometimes be interchangeable. Therefore, in the present disclosure, "the source electrode" and "the drain electrode" are interchangeable.

In the present disclosure, "an electrical connection" includes a case where constituent elements are connected via an element having a certain electrical action. The "element with a certain electric action" is not particularly limited as long as it can transmit and receive electrical signals between the connected constituent elements. An "element with a certain electrical action" may be, for example, an electrode or wiring, a switching element such as a transistor, or other functional elements such as a resistor, an inductor or a capacitor, etc.

In the present disclosure, "parallel" refers to a state in which an angle formed by two straight lines is greater than or equal to $-10°$ and smaller than or equal to $10°$, and thus further includes a state in which the angle is greater than or equal to $-5°$ and smaller than or equal to $5°$. In addition, "perpendicular" refers to a case where an angle formed by two straight lines is above $-80°$ and below $100°$, and thus further includes a case where the angle is above $-85°$ and below $95°$.

In the present disclosure, "about" means that there is no strict limit for a value, and values within a range of process and measurement errors are allowable.

In an embodiment of the present disclosure, a first direction refers to a direction away from the substrate (Z direction), a second direction refers to a direction crossing the first direction on a plane perpendicular to the substrate (X direction), and a third direction refers to a direction crossing the second direction on a plane parallel to the substrate (Y direction). Thickness and height refer to characteristics in the first direction.

FIG. 1A is a schematic diagram of a structure of an OLED display panel. As shown in FIG. 1A, the OLED display panel may include a substrate 10, and a drive structure layer 11, a light-emitting structure layer 12, a thin film encapsulation layer 13, a touch layer 14, a circular polarizer 15, a color filter layer 16, an cover coat layer 17, an optical adhesive layer 18 and a cover plate 19 which are sequentially stacked on the substrate, wherein the light-emitting structure layer 12 may include an anode 121, a pixel define layer 124, an organic light-emitting layer 122 and a cathode 123 which are sequentially stacked. The color filter layer 16 may include a first filter unit 161, a second filter unit 162, a third filter unit 163 and a black matrix 164. The drive structure layer 11 may include multiple thin film transistors T1. Due to a complicated pixel circuit, metal occupying most of a display region of an OLED display panel, a light transmittance region occupies a small proportion.

In a full-screen display apparatus, an Active Matrix (AM) driving mode is adopted in a common display region, and a Passive Matrix (PM) driving mode is adopted in a display region corresponding to an under-screen photosensitive element (such as a camera). By reducing the number of metal wires, an area of a non-light transmittance region is reduced and an area of a light transmittance region is increased. However, this solution still cannot meet the needs of under-screen camera photographing, which is not conducive to the realization of the full-screen display apparatus. On the one hand, as shown in FIG. 1A, the transmittance is very low due to the existence of light-absorbing or reflective materials in the light transmittance region. Semi-transparent materials such as Mg/Ag used as cathodes and circular polarizers (C-Pol) with transmittance less than 50% allow very little light (usually <10%) from the outside entering the camera through the panel. On the other hand, due to the existence of metal wires, the light entering an under-screen photosensitive element, such as the camera, is diffracted, which leads to a great difference between the light received by the camera and the light taken in by the outside world.

In another full-screen display apparatus, as shown in FIG. 1B, a low PPI (Pixels Per Inch) design is adopted in the display region corresponding to the under-screen photosensitive element (for example the camera). For example, a display region corresponding to an ordinary display region and a photosensitive element (such as camera) is 538 PPI/200 PPI or 400 PPI/150 PPI. By reducing the number of pixels, the area of the non-light transmittance region is reduced, the transmittance of the light transmittance region is increased, which solves the problem that the under-screen photosensitive elements, such as cameras, cannot be used due to the low transmittance of OLED. However, in this solution, the display effect of the display region corresponding to the photosensitive element (for example the camera) is poor, which leads to obvious differences in image display effect between the ordinary display region and the display region corresponding to the photosensitive element (for example the camera), which greatly degrades the user experience.

An embodiment of the present disclosure provides a display panel. In practical application, the display panel may be applied to the full-screen display apparatus, so that the transmittance of the light transmittance region in the display region corresponding to the photosensitive element can be improved, and display effect of the display region corresponding to the photosensitive element can be improved, thereby perfecting the full-screen display effect.

In an exemplary embodiment, on a direction parallel to the display panel, the display panel may include a first display region and a second display region, wherein the first display region may be a display region corresponding to a photosensitive element, and the second display region may be an ordinary display region. The number of light-emitting elements per unit region (e.g., per inch) in the first display region is smaller than the number of light-emitting elements per unit region in the second display region. The transmittance of the light transmittance region in the first display region is higher than the transmittance of the light transmittance region in the second display region. The pixels per inch (or resolution) of the first display region is approximately equal to the pixels per inch (or resolution) of the second display region. Therefore, the display effect of the first display region is consistent with that of the second display region.

Figure 2:
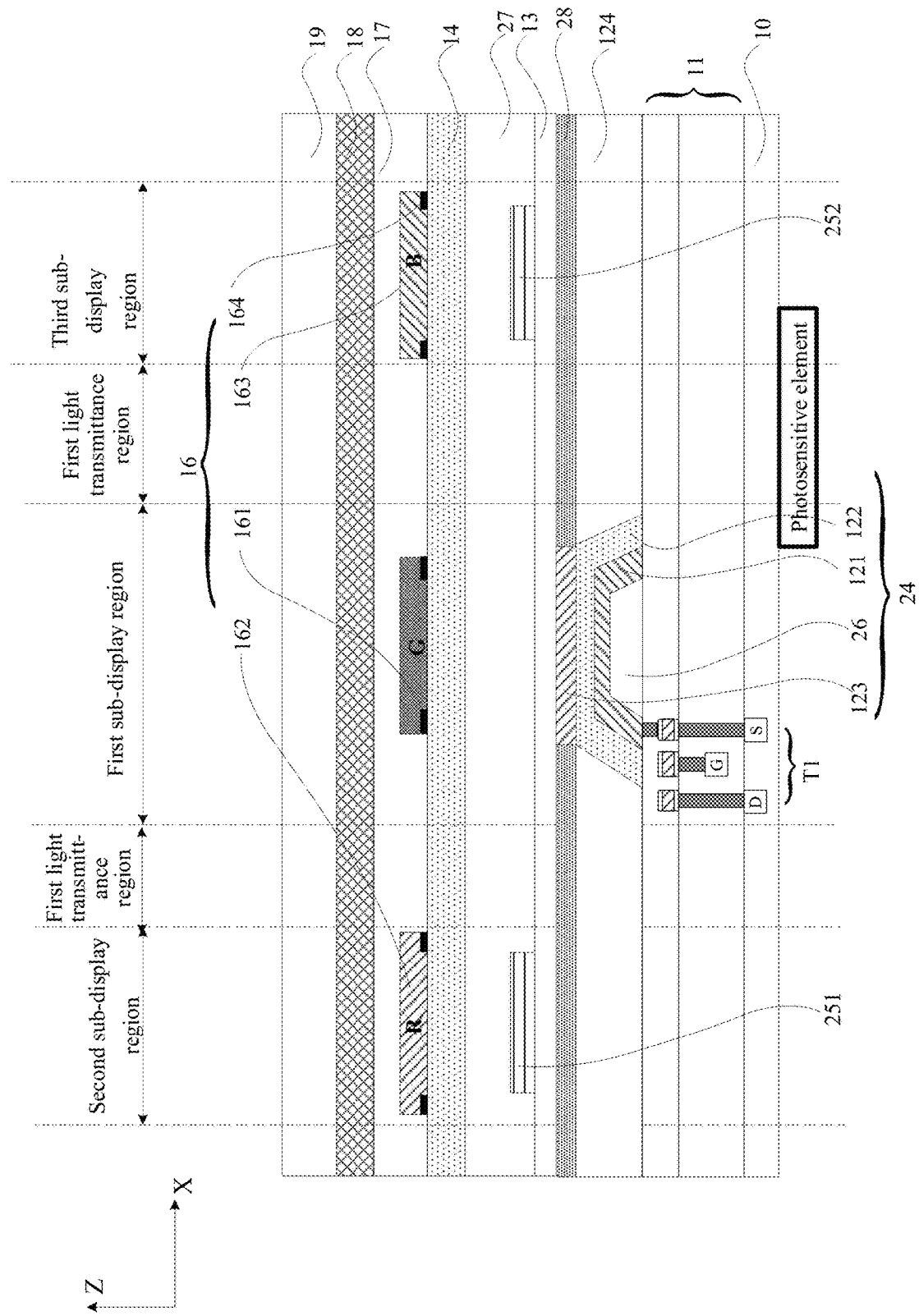
FIG. 2 is a schematic diagram of a structure of a first display region in a display panel according to an embodiment of the present disclosure.

On a direction parallel to the display panel, the first display region may include multiple sub-display regions spaced apart from each other and a first light transmittance region located between adjacent sub-display regions. As shown in FIG. 2, each first sub-display region 21 of the multiple sub-display regions may include a first light-emitting element 24 and a first filter unit 161 disposed in a first light-emergence direction of the first light-emitting element 24. Each second sub-display region 22 in the multiple sub-display regions may include a first collimating light extraction element disposed in a second light-emergence direction of the first light-emitting element 24 and a second filter unit 162 disposed in a light-emergence direction of the first collimating light extraction element 251. Each third sub-display region 23 in the multiple sub-display regions may include a second collimating light extraction element 252 disposed in a third light-emergence direction of the first light-emitting element 24 and a third filter unit 163 disposed in a light-emergence direction of the second collimating light extraction element 252.

In an exemplary embodiment, a first sub-display region of a first display region may include a first sub-display region provided with a first light-emitting element and a first filter unit, a second sub-display region provided with a first collimating light extraction element and a second filter unit, and a third sub-display region provided with a second collimating light extraction element and a third filter unit. A first surface of the first light-emitting element may emit light in a collimated manner, which is incident onto the first filter unit, and then emits light with corresponding colors through the first filter unit. A first side surface of the first light-emitting element may emit light in a side-incidence manner, which is incident onto the first collimating light extraction element at a certain angle, and then emits light with corresponding colors through the second filter unit. A second side surface of the first light-emitting element may emit light in a side-incident manner, which is incident onto the second collimating light extraction element at a certain angle, and then emits light with corresponding colors through the third filter unit.

According to the display panel provided by embodiments of the present disclosure, first light-emitting elements capable of emitting light in a collimated manner and a side-incidence manner are provided in some sub-display regions in the first display region. Collimating light extraction elements are provided in another sub-display region in the first display region, but no first light-emitting elements are provided. Neither collimating light extraction elements nor first light-emitting elements are provided in the light transmittance region in the first display region. In this way, on the one hand, the number of light-emitting elements in the first display region may be reduced, thereby reducing an area of non-light transmittance regions in the first display region while increasing an area of light transmittance regions in the first display region. As a result, external light may reach the photosensitive element below the display panel through the light transmittance regions in the first display region. On the other hand, the combination of a first light-emitting element, a collimating light extraction element and a color filter unit may improve the display resolution and the display effect of the first display region. Thus, not only transmittance of the first display region can be improved, a relatively high display effect of both the first display region and the second display region can be improved, which is beneficial to the realization of the full-screen display apparatus and improves the display effect of the full-screen display apparatus.

In an exemplary embodiment, as shown in FIG. 2, on a direction perpendicular to the display panel, the light transmittance region in the first display region may include a substrate 10, a pixel define layer 124, a cathode positioning layer 28, a thin film encapsulation layer 13, and a low-refractive-index reflecting layer 27, which are sequentially stacked. In this way, there is no cathode material in the light transmittance region in the first display region, which can improve the light transmittance of the light transmittance region.

In an exemplary embodiment, as shown in FIG. 2, on the direction perpendicular to the display panel, a first sub-display region may include a substrate 10, a first light-emitting element 24, a thin film encapsulation layer 13, a low-refractive-index reflecting layer 27, and a first filter unit 161 which are sequentially stacked. The first light-emitting element 24 may include a planarization layer 26, an anode 121, an organic emitting layer 122, and a cathode 123 which are sequentially stacked.

In an exemplary embodiment, as shown in FIG. 2, on the direction perpendicular to the display panel, a second sub-display region may include a substrate 10, a pixel define layer 124, a cathode positioning layer 28, a thin film encapsulation layer 13, a first collimating light extraction element 251, a low-refractive-index reflecting layer 27 and a second filter unit 162 which are sequentially stacked.

In an exemplary embodiment, as shown in FIG. 2, on the direction perpendicular to the display panel, a third sub-display region may include a substrate 10, a pixel define layer 124, a cathode positioning layer 28, a thin film encapsulation layer 13, a second collimating light extraction element 252, a low-refractive-index reflecting layer 27 and a third filter unit 163 which are sequentially stacked.

In an exemplary embodiment, as shown in FIG. 2, on the direction perpendicular to the display panel, a first display region may include: a substrate 10, a drive structure layer 11 disposed on the substrate 10, a light-emitting structure layer 12 disposed on a side of the drive structure layer 11 away from the substrate 10, a thin film encapsulation layer 13 disposed on a side of the light-emitting structure layer away from the substrate, a light extraction structure layer disposed on a side of the thin film encapsulation layer 13 away from the substrate, a low-refractive-index reflecting layer 27 covering the light extraction structure layer, and a color filter layer 16 disposed on a side of the low-refractive-index reflecting layer 27 away from the substrate. The light-emitting structure layer in the first display region may include: multiple first light-emitting elements 24, each first light-emitting element 24 has a first light-emergence direction, a second light-emergence direction, and a third light-emergence direction. There is a first angle between the first light-emergence direction and the display panel, a second angle between the second light-emergence direction and the display panel, and a third angle between the third light-emergence direction and the display panel. The first angle is smaller than the second included angle, and the first angle is greater than the third included angle. A light extraction structure layer may include multiple first collimating light extraction elements 251 and multiple second collimating light extraction elements 252. A first light-emitting element 24 respectively corresponds to a first collimating light extraction element 251 and a second collimating light extraction element 252. Each first collimating light extraction element 251 is disposed in a second light-emergence direction of the first light-emitting element 24 corresponding to the first collimating light extraction element 251, and each second collimating light extraction element 252 is disposed in a third light-emergence direction of the first light-emitting element 24 corresponding to the second collimating light extraction element 252. The drive structure layer may include multiple drive circuits corresponding to the first light-emitting elements one by one, and each drive circuit is configured to drive a corresponding first light-emitting elements to emit light. Each drive circuit may include a transistor T1 for being coupled with a first light-emitting element formed later and at least one storage capacitor. For example, the transistor T1 each include a gate electrode G, a source electrode S and a drain electrode D. For example, the three electrodes are electrically connected with three electrode connection parts in one-to-one correspondence. For example, electrical connections are established through vias filled with tungsten metal (i.e., tungsten vias, W-vias). Furthermore, the three electrodes may be electrically connected with other electrical structures (e.g., transistors, wirings, light-emitting elements, etc.) through corresponding electrode connections. For example, the drive circuit may include, but is not limited to, 3T1C, 4T1C, 5T1C, 5T2C, 6T1C, or 7T1C structures. For example, the drive structure layer may further include various wirings such as scanning signal lines and data signal lines, which is not limited by the present disclosure.

In an exemplary embodiment, the first light-emergence direction may be perpendicular to the display panel (that is, the angle between the first light-emergence direction and the display panel may be about 90 degrees), the angle between the second light-emergence direction and the display panel may be greater than 90 degrees, and the angle between the third light-emergence direction and the display panel may be smaller than 90 degrees.

In an exemplary embodiment, taking the first light-emergence direction perpendicular to the display panel as an example, the angle between the second light-emergence direction and the first light-emergence direction and the angle between the third light-emergence direction and the first light-emergence direction may be equal.

In an exemplary embodiment, the first light-emitting element may include, but is not limited to, any one of an Organic Light-Emitting Diode (OLED), a Quantum Dot light-emitting Diodes (QLED), and an inorganic light-emitting diode. For example, the light-emitting element may be a micron-sized light-emitting element such as Micro-LED and Mini-LED.

In an exemplary embodiment, taking the first light-emitting element as an OLED as an example, the first light-emitting element may be one or more of white light-emitting OLED, red light-emitting OLED, green light-emitting OLED and blue light-emitting OLED. Here, the embodiments of the present disclosure are not limited here.

In an exemplary embodiment, on the direction perpendicular to the display panel, as shown in FIG. 2, the first light-emitting element 24 may include: a planarization layer 26 disposed on a side of the drive structure layer 11 away from the substrate 10, an anode 121 covering the planarization layer 26, a pixel define layer (PDL) (not shown in the figure), an organic emitting layer (EML) 122 covering the anode 121, and a cathode 123 disposed on a side of the organic emitting layer 122 away from the substrate 10. Wherein the pixel define layer 124 is provided with a pixel opening exposing the anode 121, the organic emitting layer 122 is disposed in the pixel opening, and emits light of corresponding colors under the action of voltages applied by the anode 121 and the cathode 123.

In an exemplary embodiment, on the direction perpendicular to the display panel, the first light-emitting element may have a cross-sectional shape of a trapezoid, such as isosceles trapezoid. For example, as shown in FIG. 2, the light-emitting structure including the organic emitting layer 122, the anode 121, and the planarization layer 26 in the first light-emitting element 24 has a cross-sectional shape of a trapezoid. For example, the organic emitting layer 122 in the first light-emitting element 24 shown in FIG. 2 has a cross-sectional shape of a trapezoid.

Figure 3:
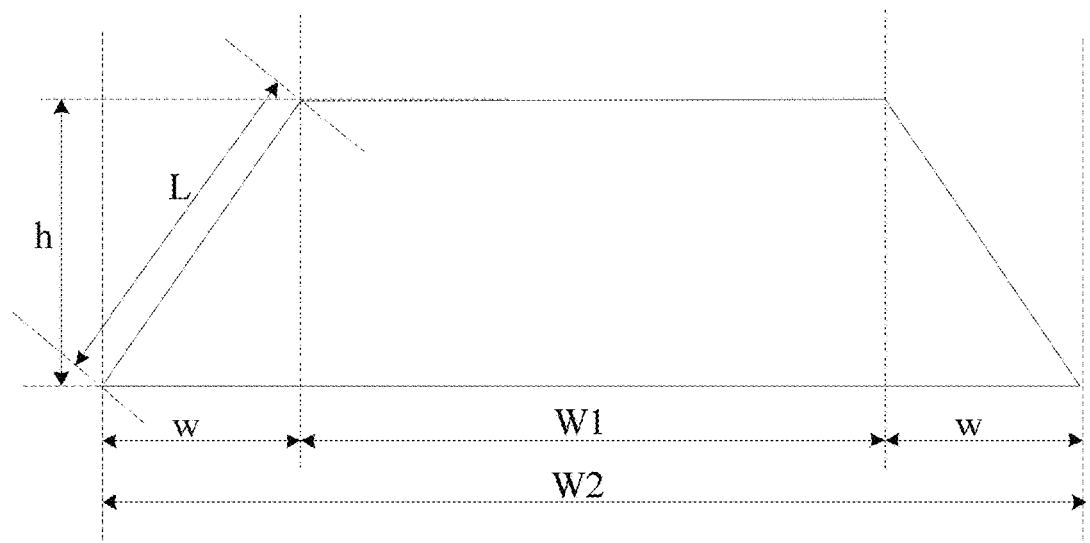
FIG. 3 is a schematic diagram of a first light-emitting element in a first display region as shown in FIG. 2.

In an exemplary embodiment, taking the example where the cross-sectional shape of the first light-emitting element (e.g., a cross-sectional graph of the light-emitting structure including an organic emitting layer, an anode and a planarization layer) is an isosceles trapezoid, as shown in FIG. 3, a lower base W2 of the cross-sectional shape of the first light-emitting element (i.e., a longer side close to the substrate) may be about 8 µm to 10 µm, and an upper base W1 of the cross-sectional shape of the first light-emitting element (i.e., a shorter side away from the substrate) may be about 4.8 µm to 7.2 µm, and a leg L of the cross-sectional shape of the first light-emitting element may be about 1.8 µm to 2.4 µm. For example, the lower base W2 of the cross-sectional pattern of the first light-emitting element may be about 9.2 µm; the upper base W1 of the cross-sectional pattern of the first light-emitting element 24 may be about 6 µm; the leg L of the cross-sectional pattern of the first light-emitting element 24 may be about 2.0 µm; and the height h of the cross-sectional pattern of the first light-emitting element 24 may be about 1.2 µm, where $L^2=h^2+w^2$ and $W2=W1+2w$.

In an exemplary embodiment, an organic emitting layer may further include one or more of a Hole Injection Layer (HIL), a Hole Transport Layer (HTL), a Hole Block Layer (HBL), an Electron Block Layer (EBL), an Electron Injection Layer (EIL) and an Electron Transport Layer (ETL). Driven by voltages of the anode and the cathode, light is emitted using the light-emitting characteristics of the organic material according to the required gray scale.

In an exemplary embodiment, on the direction perpendicular to the display panel, in the first light-emitting element, a cross-sectional shape of the planarization layer may be trapezoidal, rectangular, or the like.

In an exemplary embodiment, the material of the planarization layer may include polyimide.

In an exemplary embodiment, the planarization layer may have a thickness of 1 µm to 3 µm. For example, the planarization layer may have a thickness of about 1.2 µm.

In an exemplary embodiment, on the direction perpendicular to the display panel, in the first light-emitting element, a cross-sectional shape of the anode may be trapezoidal.

In an exemplary embodiment, the anode may adopt a composite structure of metal and transparent oxide, wherein the metal material may be Ag (silver) etc., and the transparent oxide material may be indium tin oxide (ITO) or indium zinc oxide (IZO). For example, the anode may be a composite structure of ITO-Ag-ITO, ITO-Al-ITO, Ag-ITO, Ag-IZO, etc.

In an exemplary embodiment, a metal layer of the anode may have a thickness of about 800 Å to 1000 Å, and a transparent oxide of the anode may have a thickness of about 50 Å to 100 Å. For example, if the anode is composed of an ITO-Ag-ITO composite structure, an ITO layer in the anode may have a thickness of about 80 Å, and an Ag layer in the anode may have a thickness of about 1000Å.

In an exemplary embodiment, the material of the organic emitting layer may be an organic electroluminescent material.

In an exemplary embodiment, in the first sub-display region of the first display region, an orthographic projection of the organic emitting layer on the substrate covers an orthographic projection of the anode on the substrate. The orthographic projection of the anode on the substrate covers an orthographic projection of the planarization layer on the substrate.

In an exemplary embodiment, organic emitting layers of the first light-emitting elements emitting different colors of light are different. For example, first light-emitting elements emitting red light include red organic emitting layers, first light-emitting elements emitting green light include green organic emitting layers, first light-emitting elements emitting blue light include blue organic emitting layers, and first light-emitting elements emitting white light include white organic emitting layers.

In an exemplary embodiment, the organic emitting layer may be formed by evaporation using a Fine Metal Mask (FMM) or an Open Mask, or by ink jet process.

In an exemplary embodiment, the material of the cathode in the first display region may be a metal material or an alloy material, and the metal material may be magnesium (Mg), silver (Ag), aluminum (Al), etc., and the alloy material may be Mg/Ag alloy, etc., for example, a ratio of Mg:Ag may be about 3:7 to 1:9.

In an exemplary embodiment, an orthographic projection of the cathode on the substrate overlaps with an orthographic projection of the organic emitting layer on the substrate. In this way, by adopting a cathode patterning method, the cathode material is disposed only in the sub-display region in the first display region, and there is no cathode material in the light transmittance region in the first display region, so that the light transmittance of the light transmittance region can be improved.

In an exemplary embodiment, the cathode in each first sub-display region in the first display region may be prepared by vapor deposition using an Open Mask.

In an exemplary embodiment, an orthographic projection of the cathode on the substrate in the first display region covers an orthographic projection of the organic emitting layer on the substrate.

Figure 4:
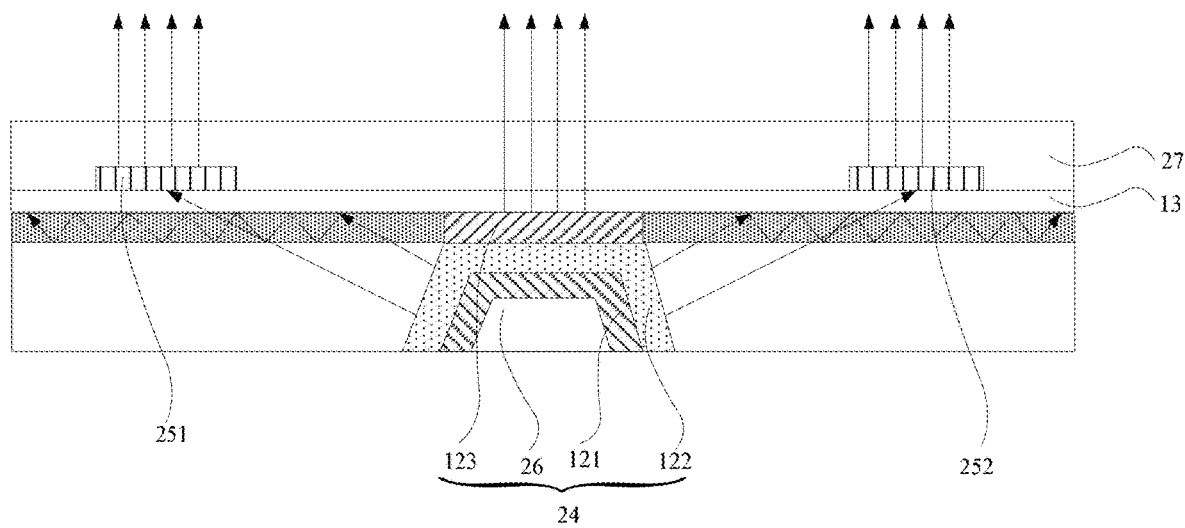
FIG. 4 is a schematic diagram of collimating light extraction and total reflection in a first display region according to an embodiment of the present disclosure.

In an exemplary embodiment, as shown in FIG. 4, the light emitted from the organic emitting layer in the first light-emitting element may be divided into: a first part of the light incident onto the first collimating light extraction element, a second part of the light incident onto the second collimating light extraction element, a third part of the light incident onto the second filter unit, and other light except the first part, the second part and the third part of light. Other light incident onto a region where the collimating light extraction elements do not exist will be totally reflected due to the low-refractive-index reflecting layer, and light leakage and color mixing can be avoided, and the display effect of the first display region can be further improved. Here, according to Goos-Hanchen shift, waveguide locking needs a certain penetration depth to reduce an attenuation field to zero, that is, to satisfy the Goos-Henson formula, the total reflection condition may be satisfied, and coupling occurs in the regions of the collimating light extraction elements to achieve collimating light extraction.

In an exemplary embodiment, the low-refractive-index reflecting layer may have a thickness of about 0.8 µm to 1.2 µm. For example, the low-refractive-index reflecting layer may have a thickness of about 1 µm.

In an exemplary embodiment, the low-refractive-index reflecting layer may be a single layer structure or a composite structure including organosiloxane.

In an exemplary embodiment, the material of the low-refractive-index reflecting layer may be organosiloxane, or a composite material including organosiloxane and silicon nitride (SiNx), or a composite material including organosiloxane and silicon oxide (SiOx). Of course, it is not limited to other materials with low-refractive index. Embodiments of the present disclosure are not limited here.

In an exemplary embodiment, the first collimating light extraction element is used to collimate and extract the light incident from the first light-emitting element along a second light-emergence direction, and the extracted light from a light-emergence surface of the first collimating light extraction element is emergent along a first light-emergence direction onto a second filter unit (a filter unit corresponding to the first collimating light extraction element). The second collimating light extraction element is used to collimate and extract the light incident from the first light-emitting element along a third light-emergence direction, and the extracted light from a light-emitting surface of the second collimating light extraction element is emergent along a first light-emergence direction onto a third filter unit (a filter unit corresponding to the second collimating light extraction element).

In an exemplary embodiment, the first collimating light extraction element and the second collimating light extraction element may be grating elements, for example, nano-gratings.

In an exemplary embodiment, taking the first collimating light extraction element and the second collimating light extraction element as nano-gratings as an example, a grating pitch of the nano-gratings may be about 301 nm to 400 nm, and a height of the nano-gratings may be about 160 nm to 240 nm. For example, the grating pitch of the nano-gratings may be about 377 nm, and the height of the nano-gratings may be 200 nm.

In an exemplary embodiment, the thin film encapsulation layer may have a thickness of about 4 μm to 15 μm.

In an exemplary embodiment, the thin film encapsulation layer may be made of transparent material to ensure that the light emitted by the first light-emitting element can be transmitted to the corresponding collimating light extraction element in the light extraction structure layer and to the corresponding filter unit in the color filter layer.

In an exemplary embodiment, on a direction perpendicular to the display panel, as shown in FIG. 2, the color filter layer 16 in the first display region may include: a black matrix 164 disposed on a side of the low-refractive-index reflecting layer 27 away from the substrate and a color film layer disposed on a side of the black matrix 35 away from the substrate 10. The black matrix 164 may include multiple openings. The color film layer may include multiple first filter units 161, multiple second filter units 162 and multiple third filter units 163, which are disposed in multiple openings of the black matrix 164 in one-to-one correspondence. Wherein, the first filter unit 161 is disposed at a position corresponding to a position of the first light-emitting element 24 (i.e., the first filter unit 161 is located in the first light-emergence direction of the first light-emitting element 24, which faces the first filter unit 161). The first filter unit 161 is used to filter out the light of corresponding colors from the light incident from the first light-emitting element 24 along the first light-emergence direction and make the light of corresponding colors emerge. The second filter unit 162 is disposed at a position corresponding to a position of the first collimating light extraction element 251 (i.e., the light-emergence direction of the first collimating light extraction element 251 faces the second filter unit 162 and the second light-emergence direction of the first light-emitting element 24 faces the first collimating light extraction element 251). The second filter unit 162 is used to filter out the light of corresponding colors from the light incident from the first collimating light extraction element 251 along the first light-emergence direction and make the light of corresponding colors emerge. The third filter unit 163 is disposed at a position corresponding to a position of the second collimating light extraction element 253 (i.e., the light-emergence direction of the second collimating light extraction element 252 faces the third filter unit 163 and the third light-emergence direction of the first light-emitting element 24 faces the second collimating light extraction element 252). The third filter unit 163 is used to filter out the light of corresponding colors from the light incident from the second collimating light extraction element 252 along the first light-emergence direction and make the light of corresponding colors emerge.

In an exemplary embodiment, as shown in FIG. 2, the color filter layer 16 is covered with an over coat (OC) layer 17 which is transparent and plays an insulating and planarization role. For example, the material of the OC layer may be polyester organic matter.

In an exemplary embodiment, as shown in FIG. 2, the display panel may further include other film layers. For example, on the direction perpendicular to the display panel, the first display region may further include: an cover coat layer 17 disposed on a side of the color filter layer 16 away from the substrate 10, an optical adhesive (OCA) layer 18 disposed on a side of the cover coat layer 17 away from the substrate, a cover plate 19 disposed on a side of the optical adhesive layer 18 away from the substrate, a planarization layer (not shown in the figure) disposed between the thin film encapsulation layer 13 and the low-refractive-index reflecting layer 27, a touch layer 14 disposed between the low-refractive-reflective layer 27 and the color filter layer 16, etc. For example, the cover plate may be a glass cover plate, which is not limited here.

In an exemplary embodiment, on the direction parallel to the display panel, the color filter layer in the first display region may include: multiple first filter units, multiple second filter units and multiple third filter units, and a black matrix disposed between adjacent filter units; wherein the second filter unit is disposed at a position corresponding to a position of the first collimating light extraction element (i.e., the light-emergence direction of the first collimating light extraction element faces the second filter unit, and the second light-emergence direction of the light-emitting element faces the first collimating light extraction element). The first filter unit is disposed at a position corresponding to a position of the light-emitting element (i.e., the first light-emergence direction of the light-emitting element faces the first filter unit). The third filter unit is disposed at a position corresponding to a position of the second collimating light extraction element (i.e., the light-emergence direction of the second collimating light extraction element faces the third filter unit and the third light-emergence direction of the light-emitting element faces the second collimating light extraction element). In this way, a combination of a first collimating light extraction element and a filter unit of any one of the three primary colors may be used as a sub-pixel of corresponding color, a combination of a light-emitting element emitting white light and a filter unit of any one of the three primary colors may be used as a sub-pixel of corresponding color, and a combination of a second collimating light extraction element and filter unit of any one of the three primary colors may be used as a sub-pixel of corresponding color. A combination of the sub-pixels of the three primary color may be a pixel unit in the first display region.

Here, the light-emitting principle of the first display region may be as follows: the light emitted by the first light-emitting element along the first light-emergence direction propagates to the first filter unit, and is filtered by the first filter unit, the light with corresponding colors is emergent from the first filter unit. The light emitted by the first light-emitting element along the second light-emergence direction propagates to the first collimating light extraction element, and is reflected or diffracted by the first collimating light extraction element, the light is emergent from the first collimating light extraction element along the first light-emergence direction. The light emergent from the first collimating light extraction element propagates to the second filter unit, and is filtered by the second filter unit, the light with corresponding colors is emergent from the second filter unit. The light emitted by the first light-emitting element along the third light-emergence direction propagates to the second collimating light extraction element, and is reflected or diffracted by the second collimating light extraction element, the light is emergent from the second collimating light extraction element along the first light-emergence direction. The light emergent from the second collimating light extraction element propagates to the third filter unit, and is filtered by the third filter unit, the light with corresponding colors is emergent from the third filter unit.

In an exemplary embodiment, an orthographic projection of the first filter unit on the substrate does not overlap with both an orthographic projection of the first collimating light extraction element or an orthographic projection of the second collimating light extraction element on the substrate. An orthographic projection of the second filter unit on the substrate covers an orthographic projection of the first collimating light extraction element on the substrate (i.e., an area of the orthographic projection of the second filter unit on the substrate is greater than or equal to that of the orthographic projection of the first collimating light extraction element on the substrate). An orthographic projection of the third filter unit on the substrate covers the orthographic projection of the second collimating light extraction element on the substrate (i.e., an area of the orthographic projection of the third filter unit on the substrate is greater than or equal to that of the orthographic projection of the second collimating light extraction element on the substrate).

In an exemplary embodiment, there is an overlapped region between an orthographic projection of the first filter unit on the substrate and an orthographic projection of the first light-emitting element on the substrate (there is an overlapped region between an orthographic projection of the second filter unit on the substrate and an orthographic projection of the organic emitting layer in the light-emitting element on the substrate); an orthographic projection of the second filter unit on the substrate does not overlap with an orthographic projection of the first light-emitting element on the substrate; and an orthographic projection of the third filter unit on the substrate does not overlap with an orthographic projection of the first light-emitting element on the substrate.

In an exemplary embodiment, depending on different arrangement of sub-pixels, the multiple first filter units may include any one or more of a red filter unit, a green filter unit, and a blue filter unit. The multiple second filter units may include any one or more of a red filter unit, a green filter unit, and a blue filter unit. The multiple third filter units may include any one or more of a red filter unit, a green filter unit, and a blue filter unit. Among them, the red filter unit, the green filter unit and the blue filter unit correspond to a red sub-pixel, a green sub-pixel and a blue sub-pixel respectively.

For example, a first filter unit, a second filter unit and a third filter unit are regularly arranged as repeating units. In this case, the first display region may adopt an OLED emitting white light (WOLED) evaporation solution. Then, as shown in FIG. 2, the first filter unit 161 may be the green filter unit, the second filter unit 162 may be the red filter unit, and the third filter unit 163 may be the blue filter unit. At this time, the first light-emitting element 24 may be the OLED emitting white light. In this way, the OLED emitting white light is used as a light source, the light is collimated and extracted by the first collimating light extraction element 251 and the second collimating light extraction element 252, and then the red light, the green light and the blue light are emergent from the red, green and blue (three primary colors) filter units. Then, a red sub-pixel may be formed by a combination of a first collimating light extraction element and a red second filter unit, a green sub-pixel may be formed by a combination of a OLED emitting white light and a green first filter unit, and a blue sub-pixel may be formed by a combination of a second collimating light extraction element and a blue third filter unit. And the pixel unit in the first display region may be formed by combining sub-pixels of the three primary colors.

For example, three first filter units as repeating units, three second filter units as repeating units, and three third filter units as repeating units are regularly arranged. The first of the three first filter units, the first of the three second filter units, and the first of the three third filter units may be a red filter unit, the second of the three first filter units, the second of the three second filter units, and the second of the three third filter units may be a green filter unit, and the third of the three first filter units, the third of the three second filter units, and the third of the three third filter units may be a blue filter unit. For example, three first light-emitting elements may be regularly disposed as repeating units, and the three first light-emitting elements correspond to the three first filter units one by one. Three first collimating light extraction element may be regularly disposed as repeating units, and the three first collimating light extraction elements correspond to the three second filter units; and the three second collimating light extraction element correspond to the three third filter units one by one. At this time, the first display region may adopt a RGB OLED evaporation solution, then the first of the three first light-emitting elements may be an OLED emitting red light (R OLED), the second of the three first light-emitting elements may be an OLED emitting green light (G OLED), and the third of the three first light-emitting elements may be an OLED emitting blue light (B OLED).

Figure 5:
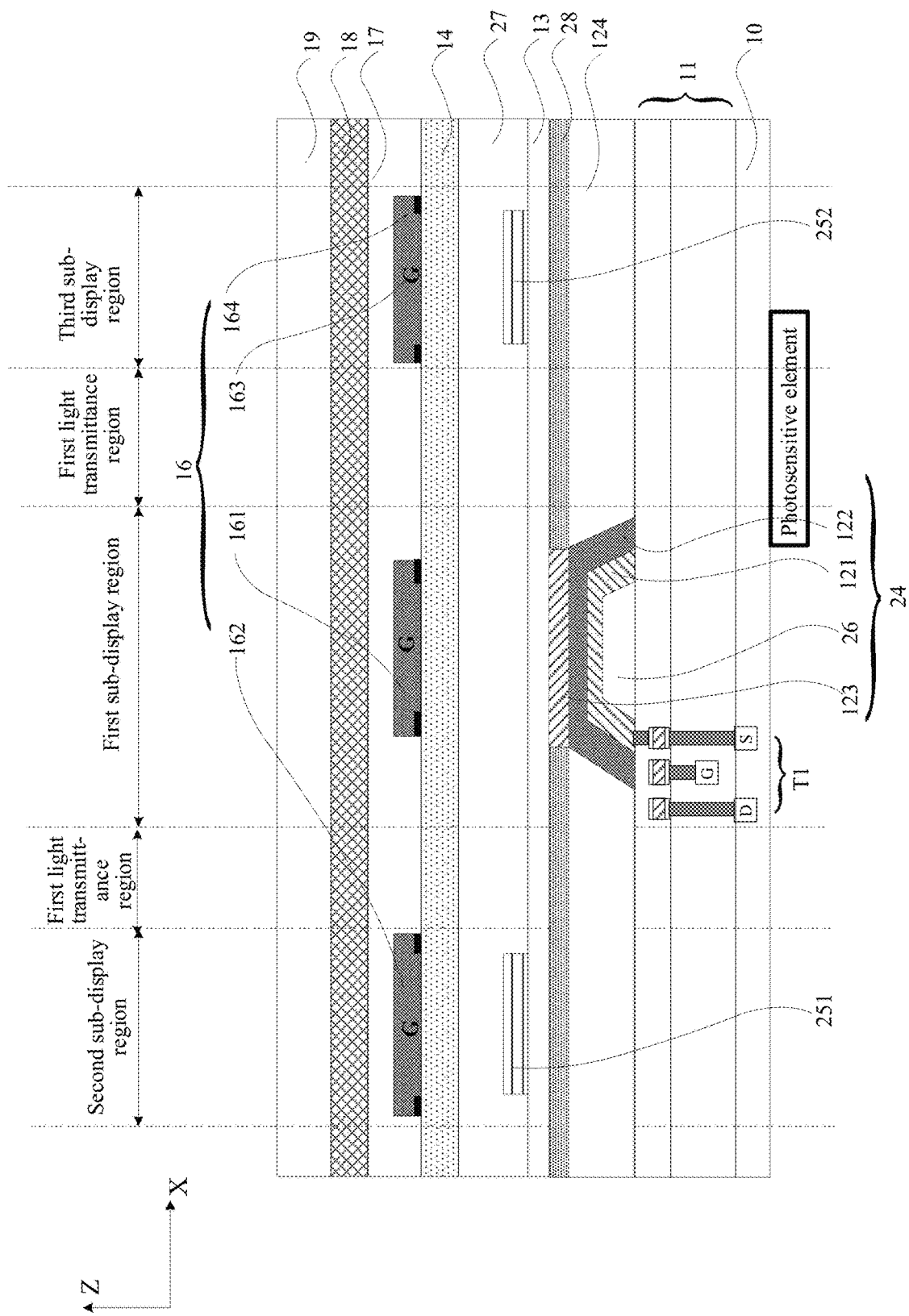
FIG. 5 is a schematic diagram of another structure of a first display region in a display panel according to an embodiment of the present disclosure.

For example, as shown in FIG. 5, taking the first light-emitting element 24 as an OLED emitting green light, and the first filter unit 161, the second filter unit 162 and the third filter unit 163 as a green filter unit as an example, the OLED emitting green light may be used as a light source, and the light is collimated by the first collimating light extraction element 251 and the second collimating light extraction element 252, and then the green light is emergent from the three green filter units. Then, a green sub-pixel may be formed by a combination of a first collimating light extraction element and a green second filter unit, another green sub-pixel may be formed by a combination of a green OLED and a green first filter unit, and another green sub-pixel may be formed by a combination of a second collimating light extraction element and a green third filter unit. In addition, the way of forming three red sub-pixels and three blue sub-pixels may be understood with reference to the description of forming three green sub-pixels, and will not be repeated here.

In an exemplary embodiment, the first display region may be a part or all of the display region of the display panel.

In an exemplary embodiment, taking the first display region as the part of the display region of the display panel as an example, a shape of the first display region may include, but is not limited to, a circle, an ellipse, a polygon, or a shape composed of partial segments of the above shapes.

In an exemplary embodiment, taking the first display region as the part of the display region of the display panel as an example, a second display region may be disposed on a side of the first display region, or may partially surround the first display region, or may be disposed around the first display region, which is not limited by the embodiments of the present disclosure.

In an exemplary embodiment, the first display region may be an area reserved for a photosensitive element, and a disposed position of the first display region corresponds to a disposed position of the photosensitive element in the display apparatus provided in some embodiments of the present disclosure. Among them, the photosensitive elements may include but are not limited to one or more of cameras, light sensors, optical sensors for face recognition, optical fingerprint sensors for fingerprint recognition, optical distance sensors and other sensors. In this way, the photosensitive element may sense light through the light transmittance region in the first display region for wording normally. The number of light-emitting elements in the first display region is reduced to reduce the area of non-light transmittance regions in the first display region to improve the transmittance of the first display region, and then the display resolution is improved by combining light-emitting elements, collimating light extraction elements and color filter units. Thus, not only transmittance of the first display region can be improved, a relatively high display effect of both the first display region and the second display region can be ensured, which is beneficial to the realization of the full-screen display apparatus and improves the display effect of the full-screen display apparatus.

In an exemplary embodiment, the number of first display regions may be set according to the number of photosensitive elements. In addition to the display function, photographing, face recognition, light collection, fingerprint recognition and other functions may also be achieved.

In an exemplary embodiment, as shown in FIG. 1A, on a direction perpendicular to the display substrate, the second display region includes: a substrate 10, a drive structure layer 11 disposed on the substrate 10, a light-emitting structure layer 12 disposed on a side of the drive structure layer 11 away from the substrate 10, a thin film encapsulation layer 13 disposed on a side of the light-emitting structure layer 12 away from the substrate 10, and a color filter layer 16 disposed on a side of the thin film encapsulation layer 13 away from the substrate 10. The drive structure layer 11 includes multiple drive circuits corresponding to the first light-emitting elements one by one, and each drive circuit is configured to drive a corresponding first light-emitting element to emit light. Each drive circuit may include multiple transistors T1 for being coupled with a first light-emitting element formed later and at least one storage capacitor. For example, the transistors T1 each include a gate electrode G, a source electrode S and a drain electrode D. For example, the three electrodes are electrically connected with the three electrode connection parts in one-to-one correspondence. For example, electrical connections are established through vias filled with tungsten metal (i.e., tungsten vias, W-vias). Furthermore, the three electrodes may be electrically connected with other electrical structures (e.g., transistors, wirings, light-emitting elements, etc.) through corresponding electrode connections. For example, the drive circuit may include, but is not limited to, 3T1C, 4T1C, 5T1C, 5T2C, 6T1C, or 7T1C structures. For example, the drive structure layer may further include various wirings such as scanning signal lines and data signal lines, which is not limited by the present disclosure. The light-emitting structure layer in the second display region includes multiple second light-emitting elements. Multiple drive circuits correspond to multiple second light-emitting elements one by one, and each drive circuit is configured to drive a corresponding second light-emitting element to emit light.

In an exemplary embodiment, the second display region may be an ordinary display region. As shown in FIG. 1A, on a plane parallel to the display panel, the second display region may include multiple sub-display regions spaced apart from each other and a second light transmittance region located between adjacent sub-display regions. The sub-display regions in the second display region each may be disposed with a second light-emitting element, and the light transmittance region in the second display region isn't disposed with the second light-emitting element, but cathode materials are stored on the pixel define layer. Here, the sub-display regions of the second display region may include multiple second light-emitting elements and multiple filter units corresponding to the multiple second light-emitting elements one by one. A first surface of the second light-emitting element (a surface away from the substrate) may emit light in a collimated manner, which is incident onto the filter unit corresponding to the second light-emitting element, and the light with corresponding colors is emergent through the filter unit. In this way, the second display region may maintain a high display effect.

In an exemplary embodiment, as shown in FIG. 1A, on a direction perpendicular to the display panel, the second light transmittance region in the second display region may include a substrate 10, a planarization layer 26, a pixel define layer 124, a cathode 123, and a thin film encapsulation layer 13 which are sequentially stacked.

In an exemplary embodiment, as shown in FIG. 1A, on a direction perpendicular to the display panel, the second light-emitting element may include a planarization layer 26 disposed on a side of the drive structure layer 11 away from the substrate 10, an anode 121 and a pixel define layer 124 disposed on the planarization layer 26, an organic emitting layer 122 disposed on a side of the anode 121 away from the substrate 10, and a cathode 123 disposed on a side of the organic emitting layer 122 away from the substrate 10.

In an exemplary embodiment, the second light-emitting element may include, but is not limited to, any one of an organic light-emitting diode, a quantum dot light-emitting diode, and an inorganic light-emitting diode. For example, the second light-emitting element may be a micron-sized light-emitting element such as Micro-LED and Mini-LED.

In an exemplary embodiment, the second light-emitting element in the second display region may be formed using an RGB OLED evaporation solution.

In an exemplary embodiment, there is an overlapped region between an orthographic projection of the organic emitting layer in the second light-emitting element on the substrate and an orthographic projection of the anode in the second light-emitting element on the substrate. There is an overlapped region between an orthographic projection of the anode in the second light-emitting element on the substrate and an orthographic projection of the planarization layer in the second light-emitting element on the substrate.

In an exemplary embodiment, the organic emitting layer in the second light-emitting element may further include at least one of a hole injection layer, a hole transport layer, an electron injection layer and an electron transport layer.

In an exemplary embodiment, the cathode in the second light-emitting element may be a common electrode, that is, multiple second light-emitting elements may share a whole side of cathode.

In an exemplary embodiment, the above display panel may include, but is not limited to, an OLED display unit, a QLED display unit, a Micro-LED display unit, etc., which is not limited by the embodiments of the present disclosure.

In an exemplary embodiment, the display panel may be a flexible OLED display panel.

In an exemplary embodiment, the substrate may be a flexible substrate. For example, the flexible substrate may adopt polyimide (PI), polyethylene terephthalate (PET) or a surface-treated polymer soft film or the like.

An embodiment of the present disclosure provides a preparation method of a display panel, including:

S11 of forming a drive structure layer on a substrate;

S12 of forming a light-emitting structure layer on the drive structure layer, wherein the light-emitting structure layer includes multiple first light-emitting elements;

S13 of forming a thin film encapsulation layer covering the light-emitting structure layer;

S14 of forming a light extraction structure layer on the thin film encapsulation layer, wherein the light extraction structure layer includes multiple first collimating light extraction elements and multiple second collimating light extraction elements; wherein each first collimating light extraction element is located in a second light-emergence direction of a first light-emitting element corresponding to the first collimating light extraction element; each second collimating light extraction element is located in a third light-emergence direction of the first light-emitting element corresponding to the second collimating light extraction element;

S15 of forming a low-refractive-index reflecting layer covering the light extraction structure layer;

S16 of forming a color filter layer on the low-refractive-index reflecting layer, wherein the color filter layer includes multiple first filter units, multiple second filter units and multiple third filter units; wherein each first filter unit is located in a first light-emergence direction of the first light-emitting element corresponding to the first filter unit; each second filter unit is located in a light-emergence direction of a first collimating light extraction element corresponding to the second filter unit; and each third filter unit is located in a light-emergence direction of a second collimating light extraction element corresponding to the third filter unit.

In an exemplary embodiment, S12 may include: sequentially forming a planarization layer, an anode and an organic emitting layer on the drive structure layer; forming a cathode positioning layer on the organic emitting layer, wherein the cathode positioning layer is provided with an opening exposing the anode; and forming a cathode in the opening.

Figure 6:
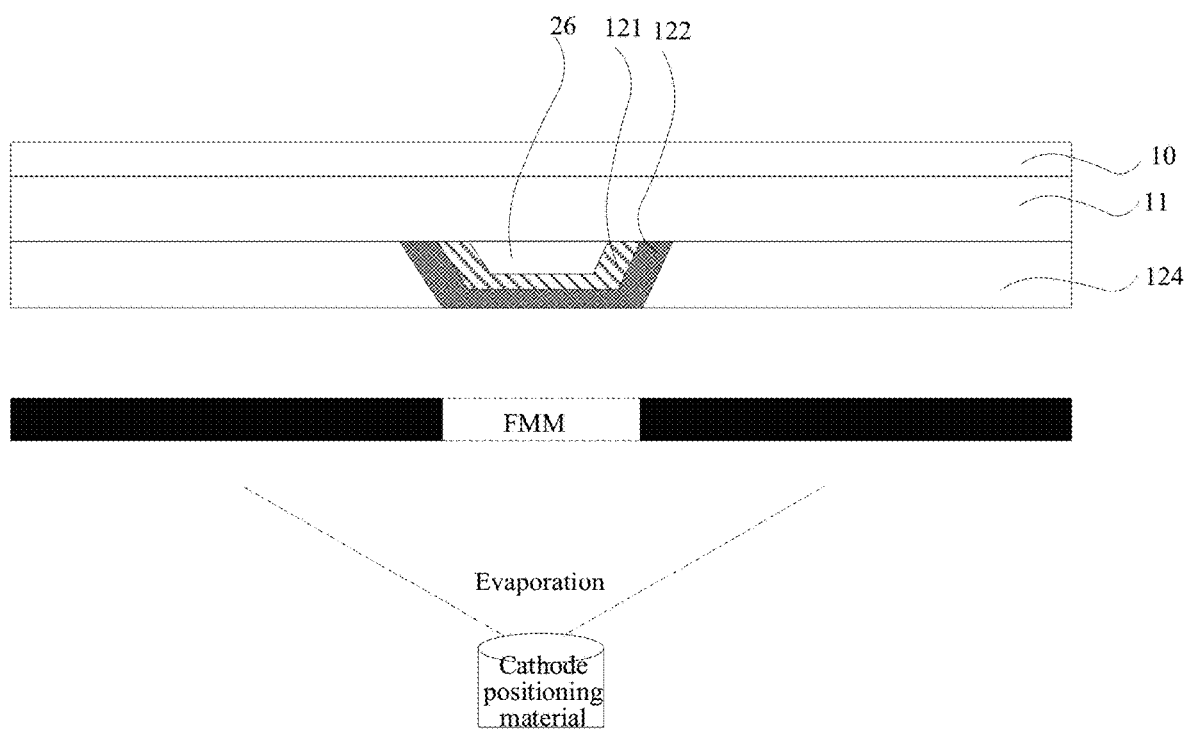
FIG. 6 is a schematic diagram of an evaporation cathode positioning layer according to an embodiment of the present disclosure.
Figure 7:
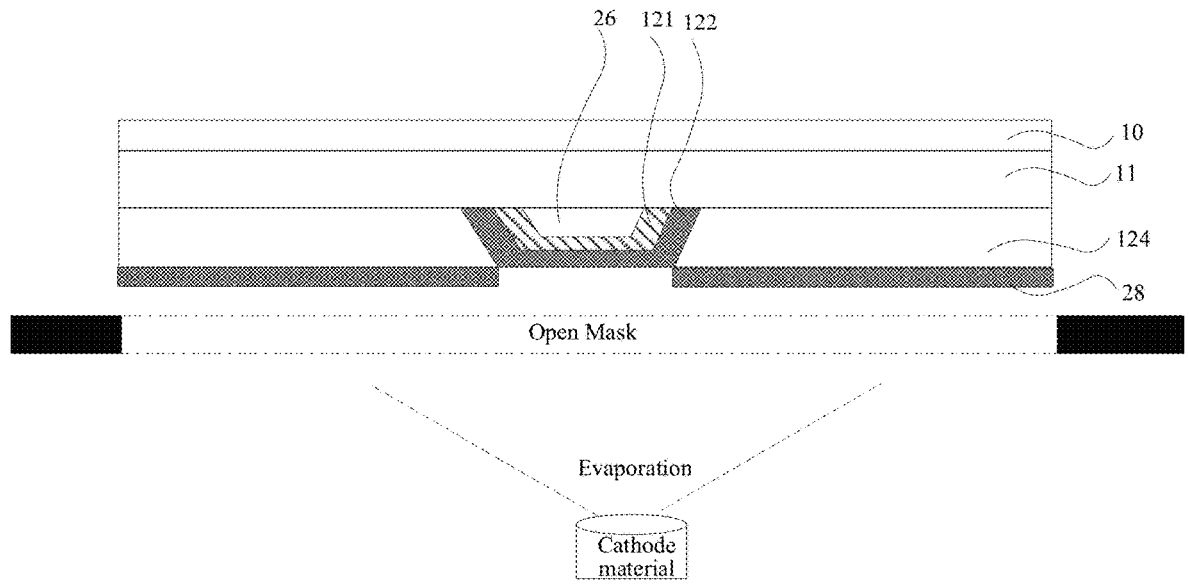
FIG. 7 is a schematic diagram of an evaporation cathode according to an embodiment of the present disclosure.
Figure 8:
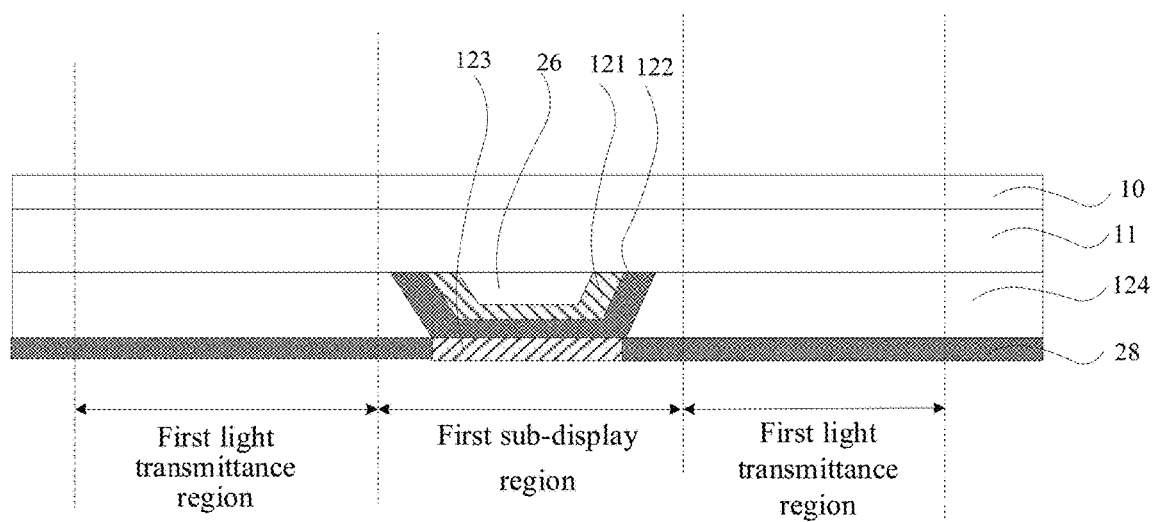
FIG. 8 is a schematic diagram after forming a pattern of a cathode according to an embodiment of the present disclosure.

For example, as shown in FIG. 6, the FMM mask is used to evaporate the cathode positioning material on a substrate where the organic emitting layer (EML) 122 is evaporated. In this way, a cathode positioning layer (Cathode Pattern Material) is evaporated on a side of the organic emitting layer away from the substrate. Next, as shown in FIG. 7, the Open Mask is used to evaporate the cathode material on a substrate where the cathode positioning layer 28 is evaporated. Herein, the cathode material is evaporated only at the position where there is no cathode positioning material due to the mutually exclusive action between the cathode positioning material and the cathode material. In this way, as shown in FIG. 8, the evaporation of the cathode 123 is completed only in the sub-display regions of the first display region, and no cathode is evaporated in the first light transmittance region of the first display region.

For example, a thin film encapsulation (TFE) layer is deposited on the substrate on which the cathode is evaporated, thus forming the thin film encapsulation layer covering the light-emitting structure layer.

For example, the touch layer and the color filter layer may be prepared by photolithography.

An embodiment of the present disclosure also provides a display apparatus, which includes the display panel and the photosensitive element in one or more of the aforementioned embodiments, and the photosensitive element is disposed in the first display region of the display panel.

In an exemplary embodiment, the photosensitive elements may include but are not limited to one or more of cameras, light sensors, optical sensors for face recognition, optical fingerprint sensors for fingerprint recognition, optical distance sensors and other sensors.

In an exemplary embodiment, the display apparatus may be any product or component with a display function such as an OLED display, a mobile phone, a tablet computer, a TV, a display, a laptop computer, a digital photo frame, a navigator, etc.

Figure 9:
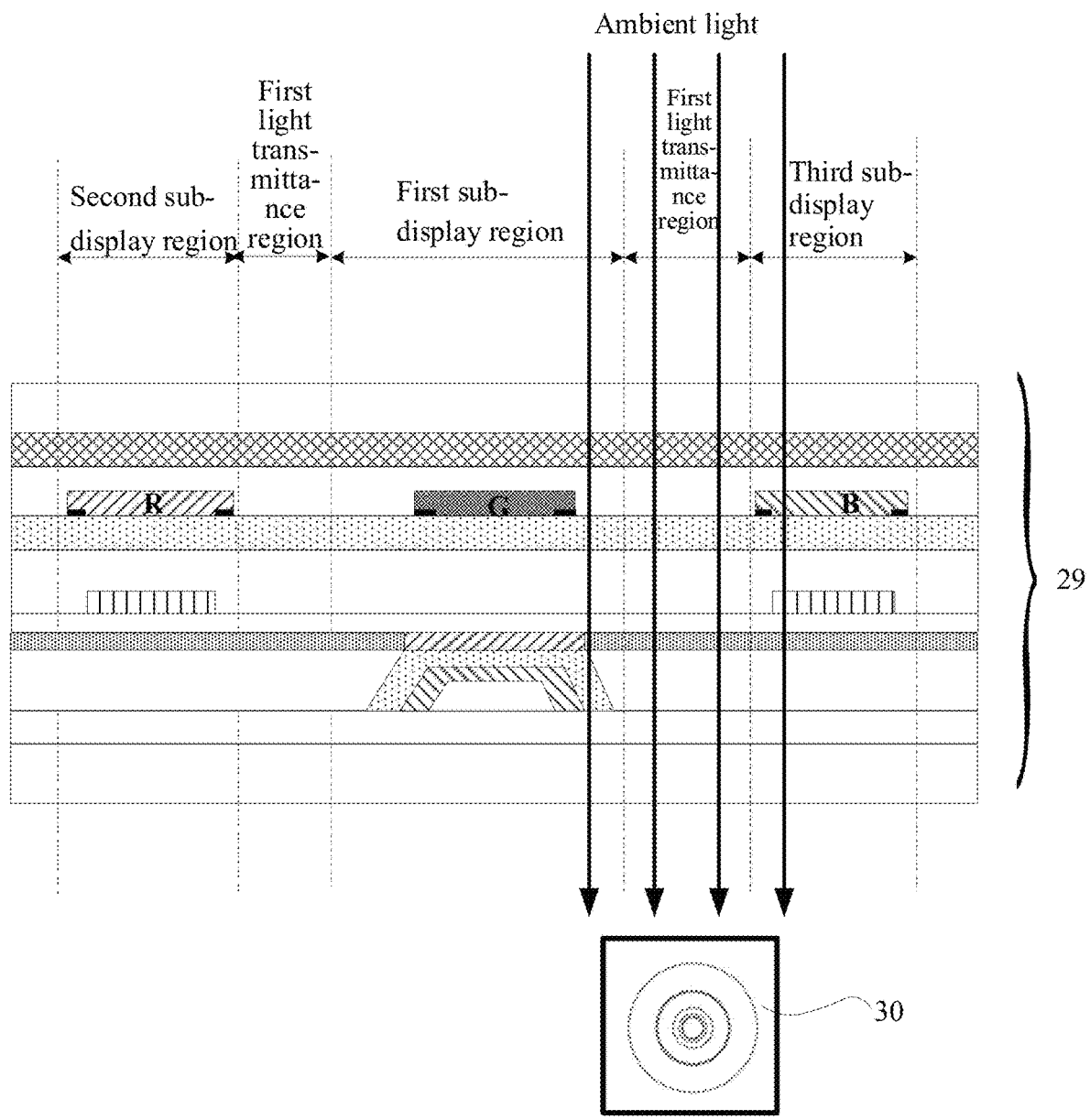
FIG. 9 is a schematic diagram of a display apparatus according to an embodiment of the present disclosure.

In an exemplary embodiment, as shown in FIG. 9, an embodiment of the present disclosure further provides a display apparatus, which includes the display panel and the camera 30 in one or more of the above embodiments, and the camera 30 is disposed in the first display region 29 of the display panel.

In this way, the camera can sense light through the light transmittance region in the first display region for working normally. The number of light-emitting elements in the first display region is reduced to reduce the area of non-light transmittance regions in the first display region to improve the transmittance of the first display region, and then the display resolution is improved by combining light-emitting elements, collimating light extraction elements and color filter units. Thus, not only transmittance of the first display region can be improved, a relatively high display effect of both the first display region and the second display region can be ensured, which is beneficial to the realization of the full-screen display apparatus and improves the display effect of the full-screen display apparatus. In this way, the problem that the under-screen camera cannot be applied due to the low transmittance of OLED is solved.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

The drawings in the present disclosure only refer to the structures involved in the present disclosure, and common designs may be referred to for other structures. The embodiments of the present disclosure, i.e., the features in the embodiments may be combined with each other to obtain a new embodiment if there is no conflict.

Those of ordinary skills in the art should understand that modifications or equivalent substitutions may be made to the technical solutions of the present disclosure without departing from the essence and scope of the technical solutions of the present disclosure, all of which should be included within the scope of the claims of the present disclosure.

What is claimed is:

1. A display panel, comprising:
   a first display region, the first display region comprises a plurality of sub-display regions and a first light transmittance region located between adjacent sub-display regions;
   each first sub-display region of the plurality of sub-display regions comprises a first light-emitting element and a first filter unit disposed in a first light-emergence direction of the first light-emitting element;
   each second sub-display region in the plurality of sub-display regions comprises a first collimating light extraction element disposed in a second light-emergence direction of the first light-emitting element and a second filter unit disposed in a light-emergence direction of the first collimating light extraction element; and
   each third sub-display region in the plurality of sub-display regions comprises a second collimating light extraction element disposed in a third light-emergence direction of the first light-emitting element and a third filter unit disposed in a light-emergence direction of the second collimating light extraction element.

2. The display panel according to claim 1, wherein on a direction perpendicular to the display panel, the first light-emitting element has a cross-sectional shape of a trapezoid.

3. The display panel according to claim 2, wherein the trapezoid is an isosceles trapezoid with an upper base of 8 μm to 10 μm, a lower base of 4.8 μm to 7.2 μm, and a leg of 1.8 μm to 2.4 μm.

4. The display panel according to claim 1, wherein an angle between the first light-emergence direction and the display panel is 90 degrees, an angle between the second light-emergence direction and the display panel is greater than 90 degrees, and an angle between the third light-emergence direction and the display panel is smaller than 90 degrees.

5. The display panel according to claim 4, wherein an angle between the second light-emergence direction and the first light-emergence direction equals to an angle between the third light-emergence direction and the first light-emergence direction.

6. The display panel according to claim 1, wherein the first collimating light extraction element and the second collimating light extraction element each is a grating element.

7. The display panel according to claim 6, wherein the grating element is a nano-grating with a grating pitch of 301 nm to 400 nm and a height of 160 nm to 240 nm.

8. The display panel according to claim 1, wherein on a direction perpendicular to the display panel, the first display region comprises: a substrate, a drive structure layer disposed on the substrate, a light-emitting structure layer disposed on a side of the drive structure layer away from the substrate, a thin film encapsulation layer disposed on a side of the light-emitting structure layer away from the substrate, a light extraction structure layer disposed on a side of the thin film encapsulation layer away from the substrate, a low-refractive-index reflecting layer covering the light extraction structure layer, and a color filter layer disposed on a side of the low-refractive-index reflecting layer away from the substrate,
   wherein the light-emitting structure layer comprises a plurality of first light-emitting elements, wherein the first light-emitting elements respectively emit light along the first light-emergence direction, the second light-emergence direction and the third light-emergence direction;
   the light extraction structure layer comprises a plurality of first collimating light extraction elements and a plurality of second collimating light extraction elements, wherein each first collimating light extraction element is located in the second light-emergence direction of the first light-emitting element corresponding to the first collimating light extraction element; each second collimating light extraction element is located in the third light-emergence direction of the first light-emitting element corresponding to the second collimating light extraction element; and
   the color filter layer comprises a plurality of first filter units, a plurality of second filter units and a plurality of third filter units, wherein each first filter unit is located in the first light-emergence direction of the first light-emitting element corresponding to the first filter unit; each second filter unit is located in the light-emergence direction of the first collimating light extraction element corresponding to the second filter unit; and each third filter unit is located in the light-emergence direction of the second collimating light extraction element corresponding to the third filter unit.

9. The display panel according to claim 8, wherein the low-refractive-index reflecting layer is a single layer structure or a composite structure comprising organosiloxane.

10. The display panel according to claim 8, wherein the low-refractive-index reflecting layer has a thickness of 0.8 μm to 1.2 μm.

11. The display panel according to claim 8, wherein an orthographic projection of the first filter unit on the substrate is overlapped with none of an orthographic projection of the first collimating light extraction element and an orthographic projection of the second collimating light extraction element on the substrate;
   an orthographic projection of the second filter unit on the substrate covers the orthographic projection of the first collimating light extraction element on the substrate; and
   an orthographic projection of the third filter unit on the substrate covers the orthographic projection of the second collimating light extraction element on the substrate.

12. The display panel according to claim 8, wherein there is an overlapped region between an orthographic projection of the first filter unit on the substrate and an orthographic projection of the first light-emitting element on the substrate;
   an orthographic projection of the second filter unit on the substrate is not overlapped with the orthographic projection of the first light-emitting element on the substrate; and
   an orthographic projection of the third filter unit on the substrate is not overlapped with the orthographic projection of the first light-emitting element on the substrate.

13. The display panel according to claim 8, wherein on the direction perpendicular to the display panel, the first light-emitting element comprises: a planarization layer disposed on a side of the drive structure layer away from the substrate, an anode covering the planarization layer, an organic emitting layer covering the anode, and a cathode disposed on a side of the organic emitting layer away from the substrate, wherein light-emitting structures of the planarization layer, the anode and the organic emitting layer each has a cross-sectional shaped of a trapezoid.

14. The display panel according to claim 13, wherein an orthographic projection of the cathode on the substrate is overlapped with an orthographic projection of the organic emitting layer on the substrate.

15. A display apparatus, comprising:
a display panel and a photosensitive element, and the photosensitive element is disposed in a first display region of the display panel;
the display panel comprises the first display region, and the first display region comprises a plurality of sub-display regions and a first light transmittance region located between adjacent sub-display regions;
each first sub-display region of the plurality of sub-display regions comprises a first light-emitting element and a first filter unit disposed in a first light-emergence direction of the first light-emitting element;
each second sub-display region in the plurality of sub-display regions comprises a first collimating light extraction element disposed in a second light-emergence direction of the first light-emitting element and a second filter unit disposed in a light-emergence direction of the first collimating light extraction element; and
each third sub-display region in the plurality of sub-display regions comprises a second collimating light extraction element disposed in a third light-emergence direction of the first light-emitting element and a third filter unit disposed in a light-emergence direction of the second collimating light extraction element.

16. The display apparatus according to claim 15, wherein on a direction perpendicular to the display panel, the first light-emitting element has a cross-sectional shape of a trapezoid.

17. The display apparatus according to claim 15, wherein an angle between the first light-emergence direction and the display panel is 90 degrees, an angle between the second light-emergence direction and the display panel is greater than 90 degrees, and an angle between the third light-emergence direction and the display panel is smaller than 90 degrees.

18. The display apparatus according to claim 15, wherein the first collimating light extraction element and the second collimating light extraction element each is a grating element.

19. A preparation method for a display panel, comprising:
forming a drive structure layer on a substrate;
forming a light-emitting structure layer on the drive structure layer, wherein the light-emitting structure layer comprises a plurality of first light-emitting elements;
forming a thin film encapsulation layer covering the light-emitting structure layer;
forming a light extraction structure layer on the thin film encapsulation layer, wherein the light extraction structure layer comprises a plurality of first collimating light extraction elements and a plurality of second collimating light extraction elements; wherein each first collimating light extraction element is located in a second light-emergence direction of the first light-emitting element corresponding to the first collimating light extraction element; each second collimating light extraction element is located in a third light-emergence direction of the first light-emitting element corresponding to the second collimating light extraction element;
forming a low-refractive-index reflecting layer covering the light extraction structure layer; and
forming a color filter layer on the low-refractive-index reflecting layer, wherein the color filter layer comprises a plurality of first filter units, a plurality of second filter units and a plurality of third filter units; wherein each first filter unit is located in a first light-emergence direction of the first light-emitting element corresponding to the first filter unit; each second filter unit is located in a light-emergence direction of the first collimating light extraction element corresponding to the second filter unit; and each third filter unit is located in a light-emergence direction of the second collimating light extraction element corresponding to the third filter unit.

20. The preparation method according to claim 19, wherein forming the light-emitting structure layer on the drive structure layer comprising the plurality of first light-emitting elements comprises:
sequentially forming a planarization layer, an anode and an organic emitting layer on the drive structure layer;
forming a cathode positioning layer on the organic emitting layer, wherein the cathode positioning layer is provided with an opening exposing the anode; and
forming cathode in the opening.

* * * * *